United States Patent
Huang et al.

(10) Patent No.: US 9,245,841 B2
(45) Date of Patent: Jan. 26, 2016

(54) SEMICONDUCTOR DEVICE AND FABRICATING PROCESS FOR THE SAME

(75) Inventors: Chien-Hua Huang, Taoyuan County (TW); Chung-Ju Lee, Hsinchu (TW); Tsung-Min Huang, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 184 days.

(21) Appl. No.: 13/553,535

(22) Filed: Jul. 19, 2012

(65) Prior Publication Data

US 2014/0021612 A1  Jan. 23, 2014

(51) Int. Cl.
| | | |
|---|---|---|
| *H01L 29/08* | (2006.01) | |
| *H01L 35/24* | (2006.01) | |
| *H01L 51/00* | (2006.01) | |
| *H01L 23/522* | (2006.01) | |
| *H01L 23/532* | (2006.01) | |
| *H01L 21/768* | (2006.01) | |

(52) U.S. Cl.
CPC ...... *H01L 23/5226* (2013.01); *H01L 21/76813* (2013.01); *H01L 21/76831* (2013.01); *H01L 21/76834* (2013.01); *H01L 21/76898* (2013.01); *H01L 23/5329* (2013.01); *H01L 23/53238* (2013.01); *H01L 23/53295* (2013.01); *H01L 2924/0002* (2013.01)

(58) Field of Classification Search
CPC ............ H01L 51/0545; H01L 51/0036; H01L 51/0541; H01L 51/5012; H01L 23/5329; H01L 21/02126; H01L 23/5222; H01L 21/76835; H01L 21/76807; B82Y 10/00
USPC ............... 257/1, 40, 750, 751, 753, 758, 759, 257/762, 765, 763
See application file for complete search history.

(56) References Cited

U.S. PATENT DOCUMENTS

| | | | | |
|---|---|---|---|---|
| 6,323,131 | B1 * | 11/2001 | Obeng et al. ................... | 438/687 |
| 6,503,835 | B1 * | 1/2003 | Lee ................... | H01L 21/76834 |
| | | | | 257/E21.576 |
| 8,415,252 | B2 * | 4/2013 | Cheng et al. ................... | 438/677 |
| 2005/0093162 | A1 * | 5/2005 | Gracias .......................... | 257/759 |
| 2006/0163582 | A1 * | 7/2006 | Lee et al. ......................... | 257/66 |
| 2008/0105979 | A1 * | 5/2008 | Whelan et al. ................ | 257/751 |
| 2010/0291303 | A1 * | 11/2010 | Abys et al. ..................... | 427/343 |

* cited by examiner

*Primary Examiner* — Michelle Mandala

(74) *Attorney, Agent, or Firm* — Slater & Matsil, L.L.P.

(57) ABSTRACT

A semiconductor device and a fabricating process for the same are provided. The semiconductor device includes a base layer having a part of a reactive material; and a self-assembled protecting layer of a self-assembled molecule reacting with the reactive material formed over the part.

19 Claims, 7 Drawing Sheets

SEMICONDUCTOR DEVICE AND FABRICATING PROCESS FOR THE SAME

FIELD

The present disclosure relates to a semiconductor device and a fabricating process for the same. More particularly, it relates to a semiconductor device having a self-assembled protecting structure formed therein and a semiconductor fabricating process for forming the self-assembled protecting structure in the semiconductor device.

BACKGROUND

The manufacture of an integrated circuit (IC) in a microelectronics device involves the formation of multiple patterned metallization layers successively overlaid and stacked upon one another. Inside these metallization layers, numerous electric wirings typically referred to as the metal lines are formed in the dielectric substrate in the form of horizontal line by methodically implementing a series of fabricating processes, such as a photolithography process, an etch process, a film deposition process, a doping process and so on. Intercommunications among the stacked metallization layers rely on numerous interconnects which are metal fillings, such as aluminum or copper fillings, filled in vias (a.k.a. through-substrate-vias or through-layer-vias) or contacts vertically penetrated through the inter-metal dielectric (IMD) layers or the inter-layer dielectric (ILD) layers in the respective stacked metallization layers, descending to contact and connect with the underlying horizontal metal lines or vias, and usually formed by an etch process.

Owing to a critical concern with a resistive-capacitance (R×C) delay time characteristic dominating the circuit performance in IC, the inter-metal dielectric or inter-layer dielectric is generally made of material has a dielectric constant to be as low as possible, such as an extremely low-k (ELK) material, so as to improve the R×C delay time characteristic and to well insulate the respective metallization parts from each other for preventing crosstalk that degrades device performance by slowing circuit speed.

During a fabrication of the metal lines, the interconnects and the through-substrate-vias, for the sake of forming the vias or contacts accurately, formations of etch stop layers are introduced, as well as in order to prevent the migration of a metal material into an adjacent dielectric layer, formations of diffusion barrier layers are introduced. Accordingly, in the state of the art technique, material having a relatively lower etch rate and dielectric coefficient to gain better R×C delay time characteristic for the wafer is conventionally selected to be made as an etch stop layer, such as material selected from the group consisting of silicon carbide, silicon nitride, SiCN, SiOCN and a combination thereof. Nevertheless, a composite etch stop layer made of a tetraethoxysilane (TEOS) oxide layer overlying the conventional silicon-based etch stop layer is developed to further reduce the overall thickness and the dielectric constant for the etch stop layer.

Moreover, since metal ions, in particular copper ions, have a high tendency to migrate into an adjacent dielectric layer and ordinary oxides can not block copper ions well enough and may easily react with copper to produce undesirable copper oxides that reduce the conductivity of the copper layer, a barrier layer conventionally comprised of nitrogen in the form of a metal nitride or silicon nitride is usually introduced to be formed between an IMD/ILD layer and a copper layer for blocking copper ions.

However, the etch selectivity of the ELK layer with respect to the composite etch stop layer is not yet good enough to be satisfied, which fails to overcome a series of issues of the over etch and non-uniform etch issues resulted form different etch rates varied at center and edge portions or at dense and sparse (iso) portions for a wafer, the yield drop issue resulted from the metal damage issue and the chamber risk issue during the etch process.

Another concern with the composite etch stop layer is that although it performs better R×C delay time characteristic as compared with that of a single silicon-based layer of etch stop layer, the composite etch stop layer sandwiched between layers all over the whole wafer still brings significant affections on the R×C delay time performance for the IC especially for sub-micron semiconductor technology. Moreover, for efficiently obstructing the diffusion attacking from the metal ions, it is desired to find a diffusion barrier layer has the expected capability of well preventing diffusions from metal ions. In addition, such a multiple layered structure also raises an adhesion issue among layers.

There is a need to solve the above deficiencies/issues.

SUMMARY

In accordance with one aspect of the present disclosure, a semiconductor device includes a base layer having a part of a reactive material; and a self-assembled protecting layer of a self-assembled molecule reacting with the reactive material formed over the part.

In accordance with another aspect of the present disclosure, a semiconductor fabricating process includes providing a base layer having a surface of a reactive material; and forming a protecting structure of a self-assembled molecule having a first etch rate and reacting with the reactive material over the surface by a deposition scheme.

The present disclosure may best be understood through the following descriptions with reference to the accompanying drawings, in which:

DETAILED DESCRIPTION

Figure 1:
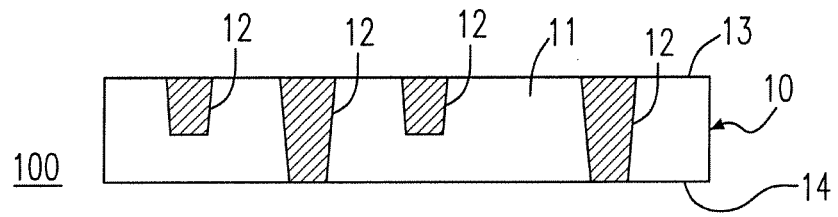
FIG. 1 is a schematic diagram illustrating a base layer in a semiconductor device in accordance with the present disclosure.

The present disclosure will be described with respect to particular embodiments and with reference to certain drawings, but the disclosure is not limited thereto but is only limited by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments described herein are capable of operation in other orientations than described or illustrated herein.

It is to be noticed that the term "including", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device including means A and B" should not be limited to devices consisting only of components A and B.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments may be practiced without these specific details. In other instances, well-known methods, structures and techniques have not been shown in detail in order not to obscure an understanding of this description.

The disclosure will now be described by a detailed description of several embodiments. It is clear that other embodiments can be configured according to the knowledge of persons skilled in the art without departing from the true technical teaching of the present disclosure, the claimed disclosure being limited only by the terms of the appended claims.

Referring now to FIGS. 1 to 6, which illustrate a first embodiment in accordance with the present disclosure with a series of transitional structures of a semiconductor device in a back-end-of-line (BEOL) fabricating stage for a semiconductor fabricating process and having a high selectivity etch stop layer utilizing self-assembled molecules made by the semiconductor fabricating process. FIG. 1 is a schematic diagram illustrating a base layer in a semiconductor device in accordance with the present disclosure. The semiconductor device 100 includes the base layer 10 and the base layer 10 has a dielectric material 11, a plurality of segments of conductive material 12 (also known as the reactive material) embedded in the dielectric material 11, a top surface 13 and a bottom surface 14. The top surface 13 of the base layer 10 is prepared by being planarized by a chemical-mechanical polishing (CMP) process. The dielectric material 11 is an extremely low-k (ELK) material and the conductive material 12 is one selected from a copper, a copper alloy, a tungsten and an aluminum. The respective segments of conductive material 12 can behave as either a metal interconnect fulfilling a through-silicon-via or a through-layer-via for electrically connecting multiple different stacked metallization layers where the conductive interconnect is referred to as a Cu via as the conductive material is a copper filling or a metal line transmitting electric signals and buried in the dielectric material 11 in the semiconductor device 100.

Figure 2:
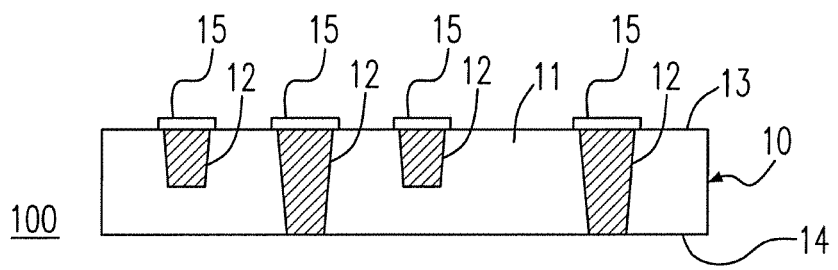
FIG. 2 is a schematic diagram illustrating a layer of self-assembled molecules in a semiconductor device in accordance with the present disclosure.

Referring to FIG. 2, which is a schematic diagram illustrating a layer of self-assembled molecules in a semiconductor device in accordance with the present disclosure. There is a plurality of segmented structures of self-assembled molecules 15 covered on the top surface 13 particularly where the conductive material 12 is filled in the through-layer-vias underneath. In order to form the structures of self-assembled molecules 15, a solution of the self-assembled molecules is distributed over the top surface 13 by implementing a known deposition scheme, such as one selected from a spin-on coating scheme, an atomic layer deposition (ALD) scheme and a vapor-based deposition scheme at least including a chemical vapor deposition (CVD) and a physical vapor deposition (PVD), so as to form a thin film (not shown in FIG. 2) of the self-assembled molecules all over the entire top surface 13.

The self-assembled molecules rest on the entire top surface 13 can fast react only with the conductive material 12 (the reactive material) and un-react with the dielectric material 11. The self-assembled molecules un-react with the dielectric material 11 are then removed by a specific solvent and the self-assembled molecules which react with the conductive material 12 and remains on the top surface 13 form the plurality of the segmented structures of self-assembled molecules 15 as shown in FIG. 2, also known as a layer of self-assembled molecules, a self-assembled etch stop layer and a self-assembled protecting layer, which all behave as an etch stop layer. The specific solvent is one selected from a group consisting of an ethanol-based solvent, an acetone-based solvent, a dimethyl sulfoxide-based solvent and a combination thereof.

The self-assembled molecules in this first embodiment are a group of molecules having a self-assembled characteristic and being capable of fast reacting only with the designated reactive material, namely the conductive material 12, in the present first embodiment. The self-assembled molecule in the present first embodiment is one selected from a group consisting of a polymeric molecule, an alkyl thiol molecule, a functionized thiol molecule, a ring thiol molecule, a dithiol molecule, a thiol-based molecule and a combination thereof.

Figure 3:
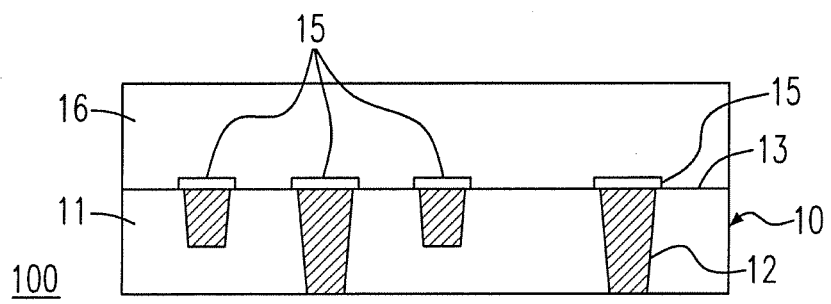
FIG. 3 is a schematic diagram illustrating a dielectric layer in a semiconductor device in accordance with the present disclosure.

Referring to FIG. 3, which is a schematic diagram illustrating a dielectric layer in a semiconductor device in accordance with the present disclosure. A dielectric layer 16 is successively formed over both the structures of the self-assembled molecules 15 and the top surface 13 by a known film deposition scheme. The dielectric layer 16 can also be the ELK material and it is applicable to use the same ELK material in the dielectric layer 16 and the dielectric material 11.

Figure 4:
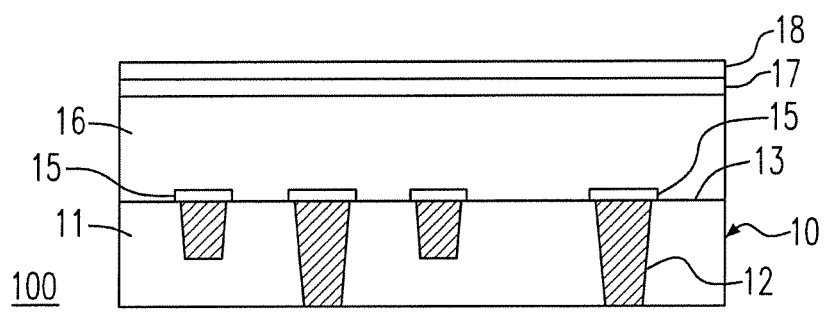
FIG. 4 is a schematic diagram illustrating an antireflection layer and a hard mask layer in a semiconductor device in accordance with the present disclosure.

Referring to FIG. 4, which is a schematic diagram illustrating an antireflection layer and a hard mask layer in a semiconductor device in accordance with the present disclosure. Successively, an antireflection layer 17 is formed on the dielectric layer 16 and the hard mask layer 18 is then formed on the antireflection layer 17. The antireflection layer 17 is a layer of nitrogen-free anti-reflective coating (NFARC) layer, the hard mask layer 18 is a Ti/TN layer and both layers 17 and 18 function as the sacrificial layer.

Figure 5:
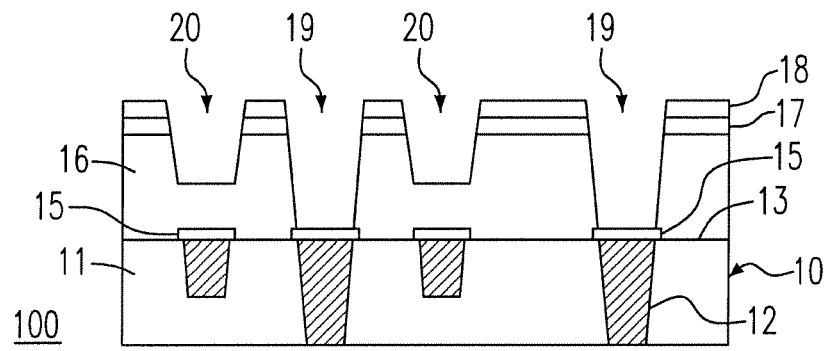
FIG. 5 is a schematic diagram illustrating trenches and vias formed by a main etch process in a semiconductor device in accordance with the present disclosure.

Referring to FIG. 5, which is a schematic diagram illustrating trenches and vias formed by a main etch process in a semiconductor device in accordance with the present disclosure. In order to create a through-layer-via penetrating the entire dielectric layer 16, a partial via etch process is pre-implemented to open the hard mask layer 18 and the antireflection layer 17 and to partially remove the material of the dielectric layer 16 right situated on where is designated to form the partial through-layer-vias 19, in the present first embodiment. Then a main etch process in particular a dry plasma etch is subsequently implemented, to continuously etch the dielectric layer 16 descending to stop at the pad-like structures of the self-assembled molecules 15, so as to form the through-layer-vias 19 and the trenches 20 in a tapered shape behaving as the trenches filling the metal lines therein.

The main etch process is stopped at the structures of self-assembled molecules 15 which behave as the etch stop layer.

The self-assembled molecules of the formed self-assembled structures 15 have a characteristic difficult to be etched and an etch rate significantly lower than that of the dielectric material 11 and 16, and an etch selectivity of the dielectric material 11 and 16 to the self-assembled molecules is higher than 5. In one embodiment, the etch selectivity of the dielectric material 11 and 16 to the self-assembled molecules can be higher than 10. Therefore, each of the pad-like self-assembled structures 15 situated on different positions over the top surface 13 can approximately have the same material removal rate resulting in the same etch rate and can be uniformly removed upon etching or by wet chemistry method, no matter at center portion or at edge portion of a wafer where the pad-like self-assembled structures 15 is situated, which achieves the accurate formation for the through-layer-vias 19 and further avoids a series of issues of the over etch issue, the non-uniform etch issue, the metal damage issue and the chamber risk resulted from metal damage issue.

Figure 6:
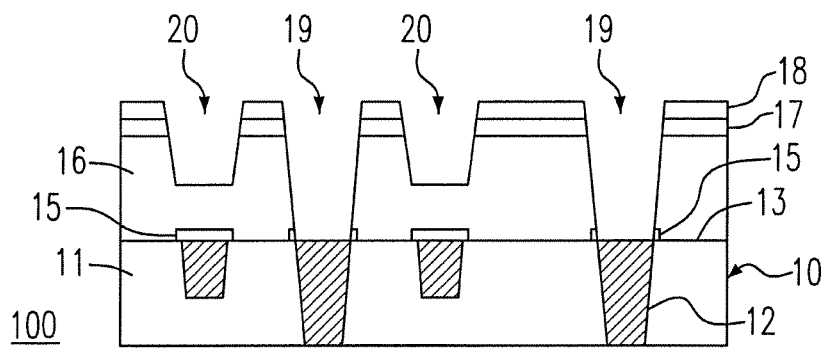
FIG. 6 is a schematic diagram illustrating a removal of the self-assembled structures by a linear removal etch process in a semiconductor device in accordance with the present disclosure.

Referring to FIG. 6, which is a schematic diagram illustrating a removal of the self-assembled structures by a linear removal etch or a wet chemistry process in a semiconductor device in accordance with the present disclosure. A linear removal (LRM) etch process is then implemented to remove the pad-like self-assembled structures 15 formed on the bottom side of the through-layer-vias 19. The linear removal etch process is one selected from a wet etch process and a dry etch process. Since the remaining structures of the self-assembled structures 15 approximately have the same thickness, the remaining structures of the self-assembled structures 15 can be uniformly removed by the linear removal each process without causing damages for yield drop resulted from the non-uniform material removal rate of the known etch stop layer or the low selectivity of ELK material to the conventional etch stop layer.

Since the conventional etch stop layer consisting of the TEOS layer and the silicon-based layer embedded entirely in the whole wafer is replaced by the self-assembled structures 15 which is not distributed all over the whole wafer but just specifically formed on several specific positions in the wafer, meaning the conventional etch stop layer which raises the R×C delay time is almost completely removed from the wafer, the R×C characteristic for the semiconductor device 100 can be reduced to 15%~20% as compared with the prior art technique. Hence, the present disclosed semiconductor device having the above-mentioned self-assembled structures is particularly suitable for sub-micron technology, or even for 20 nm node or beyond semiconductor fabricating technology. In addition, since numbers of the layered structure of the semiconductor device 100 is trimmed, the adhesion issue among layers occurring in a multiple layered structure is correspondingly mitigated effectively.

Figure 7:
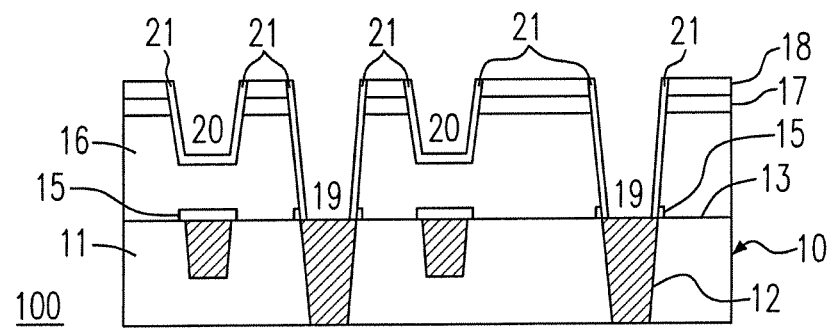
FIG. 7 is a schematic diagram illustrating a self-assembled barrier layer in a semiconductor device in accordance with the present disclosure.

Referring now to FIGS. 7 to 10, which illustrate a second embodiment in accordance with the present disclosure with a series of transitional structures of a semiconductor device in a back-end-of-line (BEOL) fabricating stage for a semiconductor fabricating process and having a self-assembled diffusion barrier layer made by the semiconductor fabricating process. FIG. 7 is a schematic diagram illustrating a self-assembled barrier layer in a semiconductor device in accordance with the present disclosure. Continuing with FIG. 6, a layer of self-assembled molecules 21, such as silane-based molecules, capable of reacting with the ELK material of the dielectric material 16 (also known as the reactive material) is formed over the quasi-horizontal bottom and the quasi-vertical side wall of the through-layer-vias 19 and the trenches 20 by a known deposition scheme including one selected from a spin-on coating scheme, an ALD scheme and a vapor-based deposition scheme to behave as one selected from a self-assembled protecting layer, a self-assembled-based diffusion barrier layer and a self-assembled molecule protecting structure.

Figure 8:
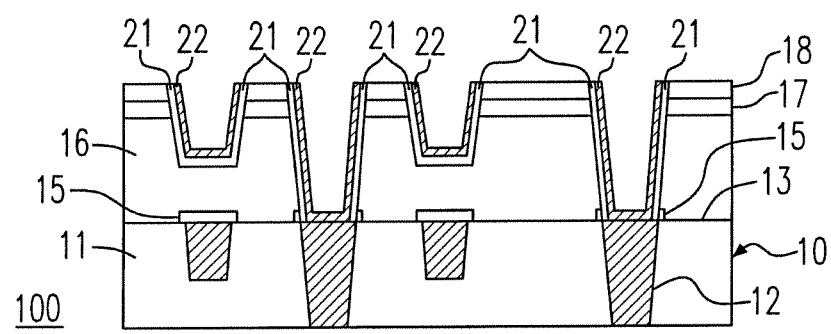
FIG. 8 is a schematic diagram illustrating a seed layer in a semiconductor device in accordance with the present disclosure.
Figure 9:
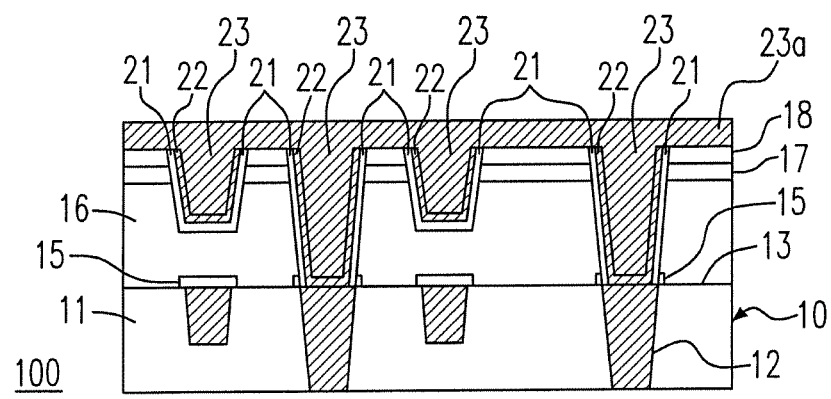
FIG. 9 is a schematic diagram illustrating a copper filling in a semiconductor device in accordance with the present disclosure.
Figure 10:
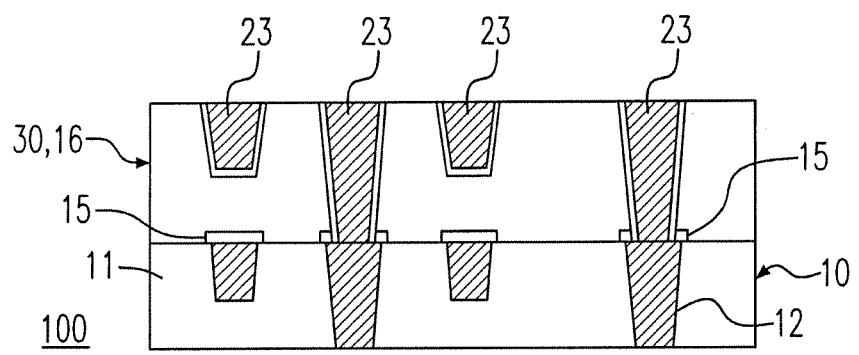
FIG. 10 is a schematic diagram illustrating a finished metallization layer in a semiconductor device in accordance with the present disclosure.

Referring to FIG. 8, which is a schematic diagram illustrating a seed layer in a semiconductor device in accordance with the present disclosure. There is a copper or copper alloy seed layer 22 for copper formed over the surface including the layer of self-assembled molecules 21 and the quasi-horizontal bottom of the through-layer-vias 19. Referring next to FIG. 9, which is a schematic diagram illustrating a copper filling in a semiconductor device in accordance with the present disclosure. There is a metal filling 23, such as a copper filling, filled into the through-layer-vias 19 and the trenches 20, with an excess filling portion referred to as an excess layer 23a formed by a known metallization filling scheme, such as an electroplating process and a PVD process. The self-assembled molecules of the self-assembled-based diffusion barrier layer, the layer of the self-assembled molecules 21 and the self-assembled protecting structure, performs a diffusion barrier characteristic that the metal material of metal filling 23 can hardly diffuse into the self-assembled-based diffusion barrier layer.

The self-assembled-based diffusion barrier layer can also function as an etch stop layer, in particular, the self-assembled-based etch stop layer, and vice versa. Both the self-assembled-based etch stop layer and the self-assembled-based diffusion barrier layer are the self-assembled protecting structure inside the semiconductor device and can be built in a form of a vertical structure, a horizontal structure, a quasi-vertical structure or a quasi-horizontal structure.

Then a CMP process is implemented to remove the excess layer 23a of the metal filling 23, the sacrificial layers including the antireflection layer 17 and the hard mask layer 18 and a portion of the dielectric layer 16, and at the same time to planarize the top surface on the dielectric layer 16 and modify the dielectric layer 16 to the target thickness. A single layer of metallization layer 30 is terminally fabricated and shown in FIG. 10, which is a schematic diagram illustrating a finished metallization layer in a semiconductor device in accordance with the present disclosure.

Figure 11:
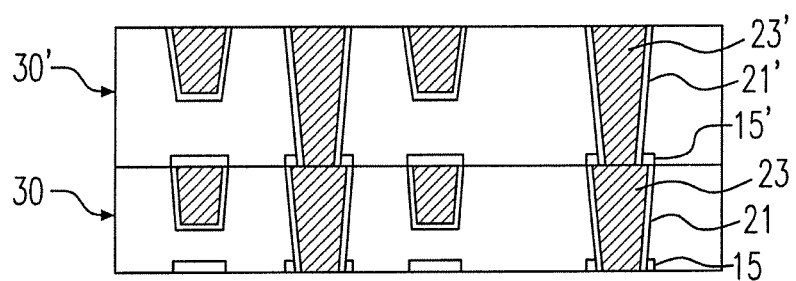
FIG. 11 is a schematic diagram illustrating a stacking metallization architecture in a semiconductor device in accordance with the present disclosure.

The disclosed semiconductor fabricating process can be repeatedly implemented to stack multiple metallization layers for forming an operable IC. Referring to FIG. 11, which is a schematic diagram illustrating a stacking metallization architecture in a semiconductor device in accordance with the present disclosure. There is the first metallization layer 30 including the plurality of segmented structures of self-assembled molecules 15, the layer of self-assembled molecules 21 and the metal filling 23 stacked on the second metallization layer 30' including the plurality of segmented structures of self-assembled molecules 15', the layer of self-assembled molecules 21' and the metal filling 23'.

Figure 12:
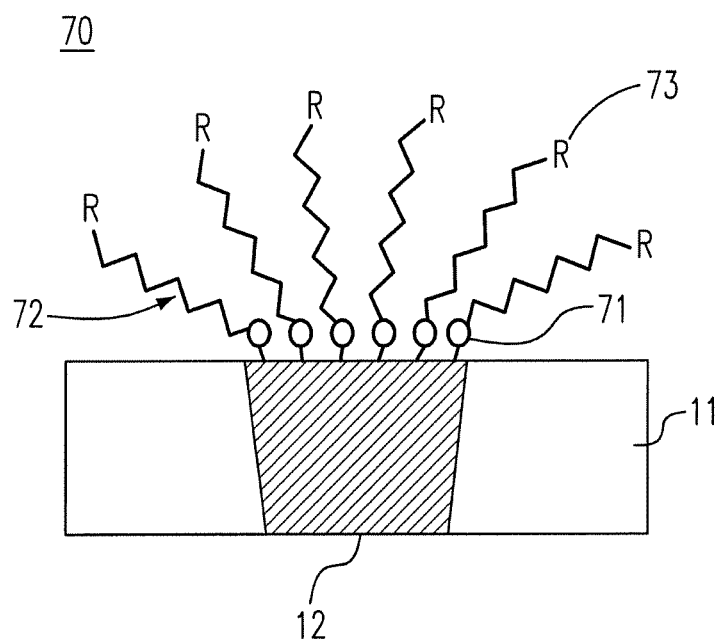
FIG. 12 is a schematic diagram illustrating a structure for a grouped radical of self-assembled molecules in accordance with the present disclosure.

Referring to FIG. 12, which is a schematic diagram illustrating a structure for a grouped radical of self-assembled molecules in accordance with the present disclosure. A single self-assembled molecule 70 includes a head group 71, a side chain group 72 and a functional group 73. The head group 71 is a radical capable of fast bonding with the conductive material 12 but un-reacting with the dielectric material 11, and capable of being self-aligned. The side chain group 72 is a radical of organic materials and inorganic materials and has a controllable length being the thickness of the self-assembled etch stop layer or the self-assembled barrier layer and ranged between 2 Å and 60 Å (angstrom). The side chains can be chemically modified with organic or inorganic materials and grated so as to improve an etch selectivity of the self-assembled etch stop layer with respect to the ELK layer and a diffusion barrier capability for the self-assembled diffusion barrier layer. The functional group 73 is a radical capable of being modified to change at least one of its interfacial property and its wetting property so as to improve the etch selectivity of the self-assembled etch stop layer with respect to the ELK layer, the diffusion barrier capability for the self-assembled diffusion barrier layer and an adhesion of the self-assembled etch stop layer with respect to the ELK layer.

The side chain group 72 has a formula of $C_nH_{2n+1}SH$, where n satisfies $1 \leq n \leq 25$ and the functional group 73 is one selected from a group consisting of a trifluoromethyl group ($-CF_3$), an amine group ($-NH_2$), a hydroxyl group ($-OH$), a nitrile group ($-CN$), a benzene, a methyl group, a ferrocenyl group and a nitrobenzyl group.

Figure 13:
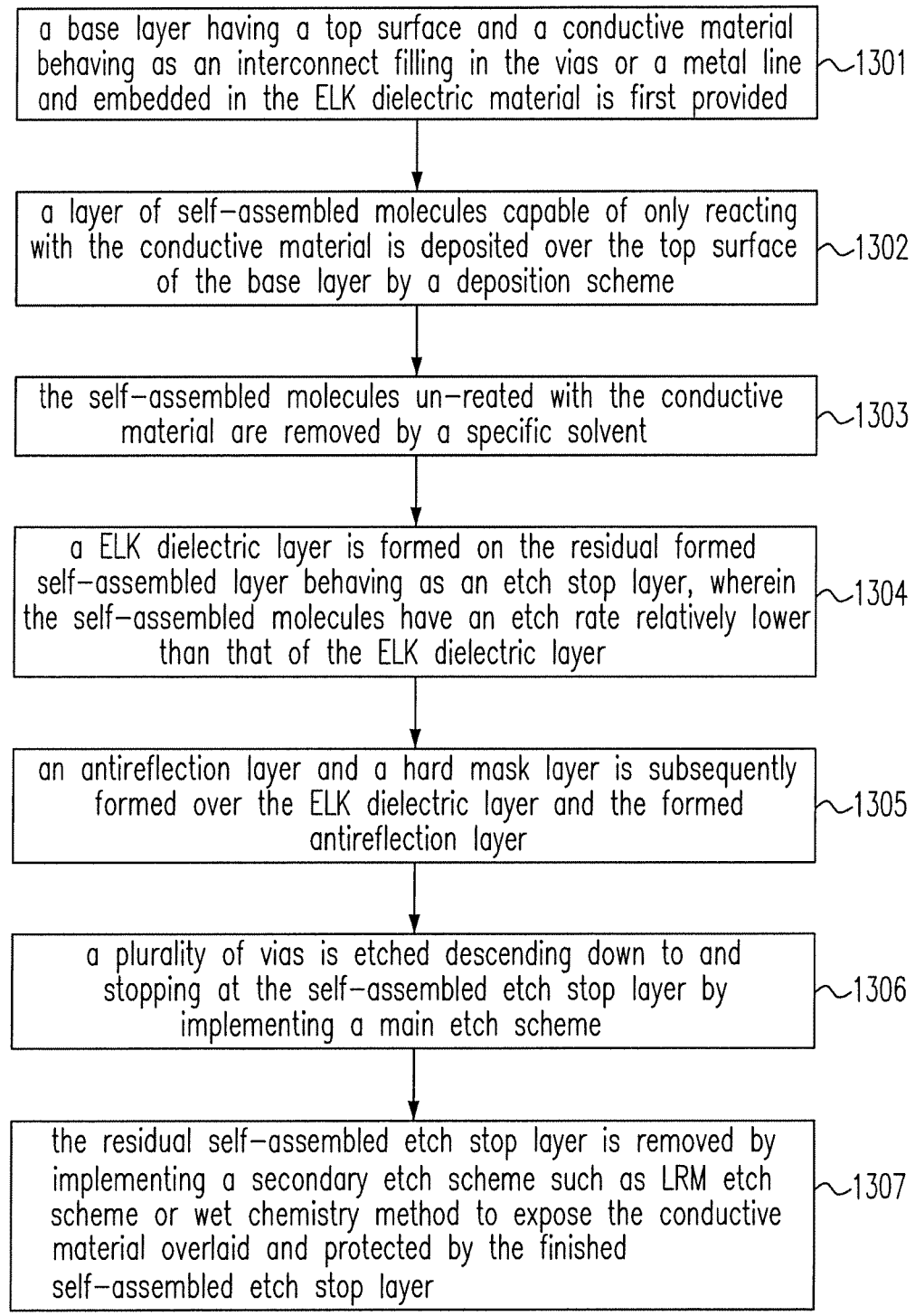
FIG. 13 is a flow chart illustrating the semiconductor fabricating process forming a semiconductor device having a high selectivity etch stop layer utilizing self-assembled molecules in accordance with the present disclosure.

To sum up the above processes for forming a series of above-mentioned transitional structures of a semiconductor device, a semiconductor fabricating process is accordingly provided. Referring now to FIG. 13, which is a flow chart illustrating the semiconductor fabricating process forming a semiconductor device having a high selectivity etch stop layer utilizing self-assembled molecules in accordance with the present disclosure.

In step 1301, a base layer having a top surface and a conductive material (reactive material) behaving as an interconnect filling in the vias or a metal line and embedded in the ELK dielectric material is first provided. In step 1302, a layer of self-assembled molecules capable of only reacting with the conductive material is deposited over the top surface of the base layer by a deposition scheme. In step 1303, the self-assembled molecules un-reacted with the conductive material are removed by a specific solvent. In step 1304, a ELK dielectric layer is formed on the residual formed self-assembled layer behaving as an etch stop layer, wherein the self-assembled molecules have an etch rate relatively lower than that of the ELK dielectric layer. In step 1305, an antireflection layer and a hard mask layer is subsequently formed over the ELK dielectric layer and the formed antireflection layer. In step 1306, a plurality of vias is etched descending down (tapered shape) to and stopping at the self-assembled etch stop layer by implementing a main etch scheme. In step 1307, the residual self-assembled etch stop layer is removed by implementing a secondary etch scheme such as LRM etch scheme or wet chemistry method to expose the conductive material overlaid and protected by the finished self-assembled etch stop layer.

Figure 14:
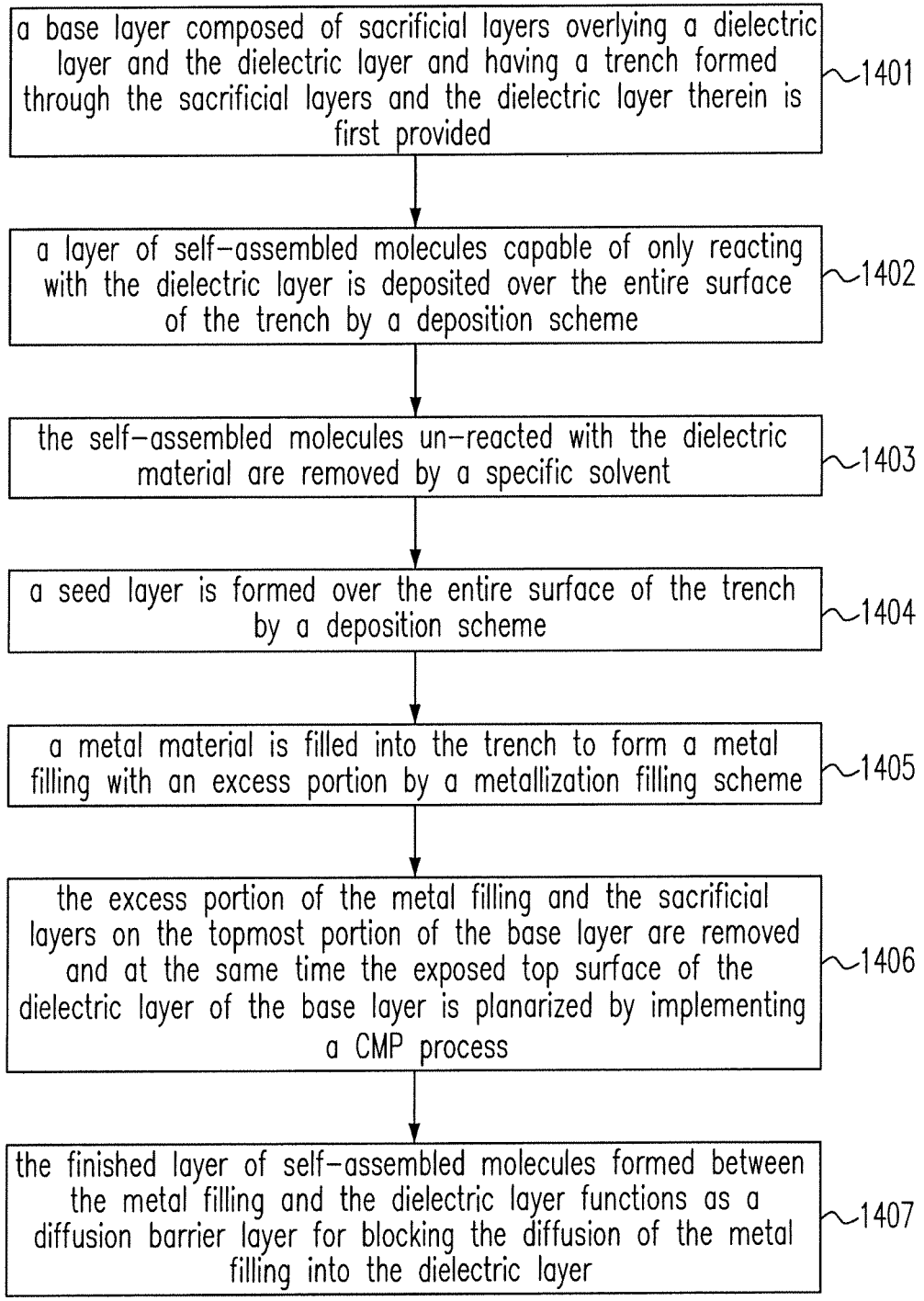
FIG. 14 is a flow chart illustrating the semiconductor fabricating process forming a semiconductor device having a diffusion barrier layer with good diffusion barrier capability utilizing self-assembled molecules in accordance with the present disclosure.

Referring now to FIG. 14, which is a flow chart illustrating the semiconductor fabricating process forming a semiconductor device having a diffusion barrier layer with good diffusion barrier capability utilizing self-assembled molecules in accordance with the present disclosure.

In step 1401, a base layer composed of sacrificial layers overlying a dielectric layer and the dielectric layer and having a trench formed through the sacrificial layers and the dielectric layer (reactive material) therein is first provided. In step 1402, a layer of self-assembled molecules capable of only reacting with the dielectric layer is deposited over the entire surface (at least including the quasi-horizontal bottom and the quasi-vertical side wall of the trench) of the trench by a deposition scheme. In step 1403, the self-assembled molecules un-reacted with the dielectric material are removed by a specific solvent. In step 1404, a seed layer is formed over the entire surface (at least including the quasi-horizontal bottom and the quasi-vertical side wall formed with the reacted self-assembled molecules of the trench) of the trench by a deposition scheme. In step 1405, a metal material is filled into the trench to form a metal filling with an excess portion by a metallization filling scheme. In step 1406, the excess portion of the metal filling and the sacrificial layers on the topmost portion of the base layer are removed and at the same time the exposed top surface of the dielectric layer of the base layer is planarized by implementing a CMP process. In step 1407, the finished layer of self-assembled molecules formed between the metal filling and the dielectric layer functions as a diffusion barrier layer for blocking the diffusion of the metal filling into the dielectric layer.

There are further embodiments provided as follows.

Embodiment 1: a semiconductor device includes a base layer having a part of a reactive material; and a self-assembled protecting layer formed over the part and being of a self-assembled molecule reacting with the reactive material.

Embodiment 2: the semiconductor device according to the above-mentioned embodiments further includes a dielectric layer formed over the self-assembled protecting layer.

Embodiment 3: the semiconductor device according to the above-mentioned embodiments, wherein the reactive material is a conductive material and the self-assembled protecting layer behaves as a self-assembled-based etch stop layer, where the conductive material is one selected from a copper, a copper alloy, a tungsten and an aluminum and an etch selectivity of the dielectric layer to the self-assembled-based etch stop layer is higher than 5.

Embodiment 4: the semiconductor device according to any one of the above-mentioned embodiments, wherein the self-assembled-based etch stop layer has a self-assembled molecule being one selected from a group consisting of a polymeric molecule, an alkyl thiol molecule, a functionized thiol molecule, a ring thiol molecule, a dithiol molecule, a thiol-based molecule and a combination thereof.

Embodiment 5: the semiconductor device according any one of the above-mentioned embodiments, wherein the self-assembled molecule includes a head group, a side chain group and a functional group, where the head group is capable of fast bonding with the conductive material, the side chain group has a controllable length and is one selected from an organic material and an inorganic material, and the functional group is capable of being modified to change at least one selected from its interfacial property and its wetting property.

Embodiment 6: the semiconductor device according to any one of the above-mentioned embodiments, wherein the conductive material is formed as one selected from a metal interconnect fulfilling a through-layer-via for electrically connecting at least two metallization layers and a buried metal line transmitting electric signals.

Embodiment 7: the semiconductor device according to any one of the above-mentioned embodiments further includes a conductive layer formed over the self-assembled protecting layer.

Embodiment 8: the semiconductor device according to any one of the above-mentioned embodiments, wherein the reactive material is a dielectric material and the self-assembled protecting layer behaves as a self-assembled-based diffusion barrier layer, where the dielectric material is an extremely low-k material and the conductive layer has a metal material that is very hardly diffused into the self-assembled-based diffusion barrier layer.

Embodiment 9: the semiconductor device according to any one of the above-mentioned embodiments, wherein the self-assembled-based diffusion barrier layer has a self-assembled molecule being one selected from a group consisting of a silane molecule and a combination thereof.

Embodiment 10: the semiconductor device according to any one of the above-mentioned embodiments, wherein the self-assembled molecule includes a head group, a side chain group and a functional group, where the head group is capable of fast bonding with the conductive material, the side chain group has a controllable length and is one selected from an organic material and an inorganic material, and the functional group is capable of being modified to change at least one selected from its interfacial property and its wetting property.

Embodiment 11: the semiconductor device according to any one of the above-mentioned embodiments, wherein the side chain group has a formula of $C_nH_{2n+1}SH$, where n satisfies $1 \leq n \leq 25$, and the functional group is one selected from a group consisting of a trifluoromethyl group ($-CF_3$), an amine group ($-NH_2$), a hydroxyl group ($-OH$), a nitrile group ($-CN$), a benzene, a methyl group, a ferrocenyl group and a nitrobenzyl group.

Embodiment 12: a fabricating process for a semiconductor device includes providing a base layer having a surface of a reactive material; and forming a protecting structure of a self-assembled molecule having a first etch rate and reacting with the reactive material over the surface by a deposition scheme.

Embodiment 13: the process according to the above-mentioned embodiments, wherein the deposition scheme is one selected from a spin-on coating scheme, an atomic layer deposition scheme and a vapor-based deposition scheme.

Embodiment 14: the process according to the above-mentioned embodiments further includes forming a dielectric layer of a dielectric material having a second etch rate over the formed self-assembled molecule protecting structure, wherein the first etch rate is relatively lower than the second etch rate.

Embodiment 15: the process according to any one of the above-mentioned embodiments further includes removing the self-assembled molecule un-reacting with the reactive material by a solvent prior to the step of forming the dielectric layer; and forming successively an antireflection layer over the dielectric layer and a hard mask layer over the antireflection layer, wherein the solvent is one selected from a group consisting of an ethanol-based solvent, an acetone-based solvent, a dimethyl sulfoxide-based solvent and a combination thereof, the antireflection layer is a layer of nitrogen-free anti-reflective coating (NFARC), and the hard mask layer is a layer of Ti/TiN.

Embodiment 16: the process according to any one of the above-mentioned embodiments, wherein the self-assembled molecule is one selected from a group consisting of a polymeric molecule, an alkyl thiol molecule, a functionized thiol molecule, a ring thiol molecule, a dithiol molecule, a thiol-based molecule and a combination thereof.

Embodiment 17: the process according to any one of the above-mentioned embodiments further includes forming a conductive layer over the formed self-assembled molecule protecting structure, wherein the conductive layer has a metal material that is very hardly diffused into the self-assembled-based diffusion barrier layer.

Embodiment 18: the semiconductor device according to any one of the above-mentioned embodiments, wherein the reactive material is a dielectric material and the formed self-assembled molecule protecting structure behaves as a self-assembled-based diffusion barrier layer, where the dielectric material is an extremely low-k material.

Embodiment 19: the process according to any one of the above-mentioned embodiments further includes forming a seed layer over the formed self-assembled molecule protecting structure prior to the step of forming the conductive layer, wherein the seed layer is one selected from a layer of copper and a layer of copper alloy and the conductive layer is one selected from a layer of copper, a layer of copper alloy, a layer of tungsten and a layer of aluminum.

Embodiment 20: the process according to any one of the above-mentioned embodiments, wherein the self-assembled-based diffusion barrier layer has a self-assembled molecule being one selected from a group consisting of a silane molecule and a combination thereof.

While the disclosure has been described in terms of what are presently considered to be the most practical and preferred embodiments, it is to be understood that the disclosure need not be limited to the disclosed embodiment. On the contrary, it is intended to cover various modifications and similar arrangements included within the spirit and scope of the appended claims, which are to be accorded with the broadest interpretation so as to encompass all such modifications and similar structures. Therefore, the above description and illustration should not be taken as limiting the scope of the present disclosure which is defined by the appended claims.

What is claimed is:

1. A semiconductor device, comprising:
a base layer including a first conductive feature and a second conductive feature;
a self-assembled protecting layer formed over the first conductive feature, the self-assembled protecting layer comprising a self-assembled molecule reacted with the first conductive feature;
a dielectric layer formed on and contacting each of the self-assembled protecting layer and the base layer; and
an opening formed through the dielectric layer, the opening exposing a top surface of the second conductive feature, wherein the top surface of the second conductive feature in the opening is free of the self-assembled protecting layer.

2. The semiconductor device according to claim 1, further comprising:
a hard mask formed over the dielectric layer.

3. The semiconductor device according to claim 1, wherein the self-assembled protecting layer comprises a self-assembled molecule being one selected from a group consisting of a polymeric molecule, an alkyl thiol molecule, a functionized thiol molecule, a ring thiol molecule, a dithiol molecule, a thiol-based molecule and combinations thereof.

4. The semiconductor device according to claim 3, wherein the self-assembled molecule includes a head group, a side chain group and a functional group, where the head group is capable of bonding with the first conductive feature and the functional group is capable of being modified to change at least one selected from its interfacial property and its wetting property.

5. The semiconductor device according to claim 1, wherein the first conductive feature is one of a through-layer-via electrically connecting at least two metallization layers and a buried metal line for transmitting electric signals.

6. The semiconductor device according to claim 1, further comprising a self-assembled diffusion barrier layer lining the opening in the dielectric layer.

7. The semiconductor device according to claim 6, wherein the self-assembled diffusion barrier layer comprises a silane molecule.

8. The semiconductor device according to claim 7, wherein the self-assembled molecule includes a head group, a side chain group and a functional group, where the head group is bonded with the first conductive feature and the functional group is capable of being modified to change at least one selected from its interfacial property and its wetting property.

9. The semiconductor device according to claim 8, wherein the side chain group has a formula of $C_nH_{2n+1}SH$, where n satisfies $1<n<25$, and the functional group is one selected from a group consisting of a trifluoromethyl group ($-CF_3$), an amine group ($-NH_2$), a hydroxyl group ($-OH$), a nitrile group ($-CN$), a benzene, a methyl group, a ferrocenyl group and a nitrobenzyl group.

10. A semiconductor device, comprising:
a first conductive feature and a second conductive feature;
a low-k dielectric layer overlying the first conductive feature and the second conductive feature, the low-k dielectric layer having an opening formed therein exposing the first conductive feature;
a first self-assembled protecting layer covering the second conductive feature;
a second self-assembled protecting layer lining the opening sidewalls and being of a self-assembled molecule that reacts with the low-k dielectric layer; and
a conductor formed on the second self-assembled protecting layer and filling the opening.

11. The semiconductor device according to claim 10, wherein the first self-assembled protecting layer has an etch selectivity higher than 5 relative to the dielectric layer.

12. The semiconductor device according to claim 11, wherein the first conductive feature has an interface with the conductor.

13. The semiconductor device according to claim 12, wherein a portion of the second self-assembled protecting layer is in contact with the interface.

14. The semiconductor device according to claim 10, wherein the second self-assembled protecting layer behaves as a self-assembled-based diffusion barrier layer, wherein the self-assembled-based diffusion barrier layer has a self-assembled silane molecule.

15. A semiconductor device comprising:
a first dielectric layer;
a first metal feature and a second metal feature in the first dielectric layer;
a self-assembled layer on the first metal feature, the self-assembled layer comprising a material that reacts with the first metal feature and does not react with the first dielectric layer and that has an etch selectivity of at least about 5 relative to the first dielectric layer, wherein the self-assembled layer does not extend from the first metal feature to the second metal feature in the first dielectric layer;
a second dielectric layer overlying the first dielectric layer; and
an opening formed through the second dielectric layer, the opening exposing a top surface of the second metal feature, wherein the top surface of the second metal feature in the opening is free of the self-assembled layer.

16. The semiconductor device according to claim 15, further comprising:
a second self-assembled layer lining sidewalls of the opening;
a conductor on the second self-assembled layer and filling the opening; and
wherein the second self-assembled layer acts as a barrier to diffusion of the conductor into the second dielectric layer.

17. The semiconductor device of claim 15, wherein the self-assembled layer comprises a self-assembled molecule being one selected from a group consisting of a polymeric molecule, an alkyl thiol molecule, a functionized thiol molecule, a ring thiol molecule, a dithiol molecule, a thiol-based molecule and a combination thereof.

18. The semiconductor device of claim 16, wherein the second self-assembled layer comprises silane molecules.

19. The semiconductor device of claim 15, further comprising a third metal feature formed in the opening, the third metal feature in contact with the second metal feature.

* * * * *